(12) United States Patent
Johnson

(10) Patent No.: US 9,070,761 B2
(45) Date of Patent: Jun. 30, 2015

(54) FIELD EFFECT TRANSISTOR (FET) HAVING FINGERS WITH RIPPLED EDGES

(71) Applicant: RF Micro Devices, Inc., Greensboro, NC (US)

(72) Inventor: Joseph Herbert Johnson, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/966,400

(22) Filed: Aug. 14, 2013

(65) Prior Publication Data

US 2014/0054602 A1 Feb. 27, 2014

Related U.S. Application Data

(60) Provisional application No. 61/693,399, filed on Aug. 27, 2012, provisional application No. 61/815,083, filed on Apr. 23, 2013.

(51) Int. Cl.
*H01L 29/78* (2006.01)
*H01L 29/66* (2006.01)
(Continued)

(52) U.S. Cl.
CPC .......... *H01L 29/78* (2013.01); *H01L 29/66477* (2013.01); *H01L 29/41725* (2013.01);
(Continued)

(58) Field of Classification Search
CPC ............ H01L 29/778; H01L 29/66431; H01L 29/66462; H01L 29/7786; H01L 29/7787; H01L 29/4238; H01L 29/41725; H01L 2924/13064

USPC ............ 257/76, 194, 288, E29.246, E21.403; 438/167, 172, 191, 286
See application file for complete search history.

(56) References Cited

U.S. PATENT DOCUMENTS 4,317,055 A 2/1982 Yoshida et al.
4,540,954 A 9/1985 Apel
(Continued)

FOREIGN PATENT DOCUMENTS

EP 1187229 A1 3/2002
EP 1826041 A1 8/2007
(Continued)

OTHER PUBLICATIONS

Chang, S.J. et al., "Improved ESD protection by combining InGaN-GaN MQW LEDs with GaN Schottky diodes," IEEE Electron Device Letters, Mar. 2003, vol. 24, No. 3, pp. 129-131.
(Continued)

*Primary Examiner* — Tucker Wright
(74) *Attorney, Agent, or Firm* — Withrow & Terranova, P.L.L.C.

(57) ABSTRACT

A field effect transistor (FET) having fingers with rippled edges is disclosed. The FET includes a semiconductor substrate having a front side with a finger axis. A drain finger is disposed on the front side of the semiconductor substrate such that a greatest dimension of the drain finger lies parallel to the finger axis. A gate finger is disposed on the front side of the semiconductor substrate. The gate finger is spaced from the drain finger such that a greatest dimension of the gate finger lies parallel to the finger axis. A source finger is disposed on the front side of the semiconductor substrate. The source finger is spaced from the gate finger such that a greatest dimension of the source finger lies parallel to the finger axis. The drain finger, the gate finger, and the source finger each have rippled edges with an axis parallel with the finger axis.

20 Claims, 4 Drawing Sheets

(51) Int. Cl.
*H01L 29/417* (2006.01)
*H01L 29/423* (2006.01)
*H01L 29/778* (2006.01)
*H01L 29/20* (2006.01)

(52) U.S. Cl.
CPC ...... *H01L29/42316* (2013.01); *H01L 29/4238* (2013.01); *H01L 29/7787* (2013.01); *H01L 29/2003* (2013.01)

(56) References Cited

U.S. PATENT DOCUMENTS

| | | |
|---|---|---|
| 4,543,535 A | 9/1985 | Ayasli |
| 4,620,207 A | 10/1986 | Calviello |
| 4,788,511 A | 11/1988 | Schindler |
| 5,028,879 A | 7/1991 | Kim |
| 5,046,155 A | 9/1991 | Beyer et al. |
| 5,047,355 A | 9/1991 | Huber et al. |
| 5,107,323 A | 4/1992 | Knolle et al. |
| 5,118,993 A | 6/1992 | Yang |
| 5,208,547 A | 5/1993 | Schindler |
| 5,227,734 A | 7/1993 | Schindler et al. |
| 5,306,656 A | 4/1994 | Williams et al. |
| 5,361,038 A | 11/1994 | Allen et al. |
| 5,365,197 A | 11/1994 | Ikalainen |
| 5,389,571 A | 2/1995 | Takeuchi et al. |
| 5,414,387 A | 5/1995 | Nakahara et al. |
| 5,485,118 A | 1/1996 | Chick |
| 5,608,353 A | 3/1997 | Pratt |
| 5,629,648 A | 5/1997 | Pratt |
| 5,698,870 A | 12/1997 | Nakano et al. |
| 5,742,205 A | 4/1998 | Cowen et al. |
| 5,764,673 A | 6/1998 | Kawazu et al. |
| 5,834,326 A | 11/1998 | Miyachi et al. |
| 5,843,590 A | 12/1998 | Miura et al. |
| 5,864,156 A | 1/1999 | Juengling |
| 5,874,747 A | 2/1999 | Redwing et al. |
| 5,880,640 A | 3/1999 | Dueme |
| 5,914,501 A | 6/1999 | Antle et al. |
| 5,949,140 A | 9/1999 | Nishi et al. |
| 6,049,250 A | 4/2000 | Kintis et al. |
| 6,064,082 A | 5/2000 | Kawai et al. |
| 6,110,757 A | 8/2000 | Udagawa et al. |
| 6,130,579 A | 10/2000 | Iyer et al. |
| 6,133,589 A | 10/2000 | Krames et al. |
| 6,177,685 B1 | 1/2001 | Teraguchi et al. |
| 6,191,656 B1 | 2/2001 | Nadler |
| 6,229,395 B1 | 5/2001 | Kay |
| 6,265,943 B1 | 7/2001 | Dening et al. |
| 6,271,727 B1 | 8/2001 | Schmukler |
| 6,285,239 B1 | 9/2001 | Iyer et al. |
| 6,306,709 B1 | 10/2001 | Miyagi et al. |
| 6,307,364 B1 | 10/2001 | Augustine |
| 6,313,705 B1 | 11/2001 | Dening et al. |
| 6,329,809 B1 | 12/2001 | Dening et al. |
| 6,333,677 B1 | 12/2001 | Dening |
| 6,342,815 B1 | 1/2002 | Kobayashi |
| 6,356,150 B1 | 3/2002 | Spears et al. |
| 6,369,656 B2 | 4/2002 | Dening et al. |
| 6,369,657 B2 | 4/2002 | Dening et al. |
| 6,373,318 B1 | 4/2002 | Dohnke et al. |
| 6,376,864 B1 | 4/2002 | Wang |
| 6,377,125 B1 | 4/2002 | Pavio et al. |
| 6,384,433 B1 | 5/2002 | Barratt et al. |
| 6,387,733 B1 | 5/2002 | Holyoak et al. |
| 6,392,487 B1 | 5/2002 | Alexanian |
| 6,400,226 B2 | 6/2002 | Sato |
| 6,404,287 B2 | 6/2002 | Dening et al. |
| 6,448,793 B1 | 9/2002 | Barratt et al. |
| 6,455,877 B1 | 9/2002 | Ogawa et al. |
| 6,475,916 B1 | 11/2002 | Lee et al. |
| 6,477,682 B2 | 11/2002 | Cypher |
| 6,521,998 B1 | 2/2003 | Teraguchi et al. |
| 6,525,611 B1 | 2/2003 | Dening et al. |
| 6,528,983 B1 | 3/2003 | Augustine |
| 6,560,452 B1 | 5/2003 | Shealy |
| 6,566,963 B1 | 5/2003 | Yan et al. |
| 6,589,877 B1 | 7/2003 | Thakur |
| 6,593,597 B2 | 7/2003 | Sheu |
| 6,608,367 B1 | 8/2003 | Gibson et al. |
| 6,614,281 B1 | 9/2003 | Baudelot et al. |
| 6,621,140 B1 | 9/2003 | Gibson et al. |
| 6,624,452 B2 | 9/2003 | Yu et al. |
| 6,627,552 B1 | 9/2003 | Nishio et al. |
| 6,633,073 B2 | 10/2003 | Rezvani et al. |
| 6,633,195 B2 | 10/2003 | Baudelot et al. |
| 6,639,470 B1 | 10/2003 | Andrys et al. |
| 6,656,271 B2 | 12/2003 | Yonehara et al. |
| 6,657,592 B2 | 12/2003 | Dening et al. |
| 6,660,606 B2 | 12/2003 | Miyabayashi et al. |
| 6,701,134 B1 | 3/2004 | Epperson |
| 6,701,138 B2 | 3/2004 | Epperson et al. |
| 6,706,576 B1 | 3/2004 | Ngo et al. |
| 6,720,831 B2 | 4/2004 | Dening et al. |
| 6,723,587 B2 | 4/2004 | Cho et al. |
| 6,724,252 B2 | 4/2004 | Ngo et al. |
| 6,727,762 B1 | 4/2004 | Kobayashi |
| 6,748,204 B1 | 6/2004 | Razavi et al. |
| 6,750,158 B2 | 6/2004 | Ogawa et al. |
| 6,750,482 B2 | 6/2004 | Seaford et al. |
| 6,759,907 B2 | 7/2004 | Orr et al. |
| 6,802,902 B2 | 10/2004 | Beaumont et al. |
| 6,815,722 B2 | 11/2004 | Lai et al. |
| 6,815,730 B2 | 11/2004 | Yamada |
| 6,822,842 B2 | 11/2004 | Friedrichs et al. |
| 6,861,677 B2 | 3/2005 | Chen |
| 6,943,631 B2 | 9/2005 | Scherrer et al. |
| 7,015,512 B2 | 3/2006 | Park et al. |
| 7,026,665 B1 | 4/2006 | Smart et al. |
| 7,033,961 B1 | 4/2006 | Smart et al. |
| 7,042,150 B2 | 5/2006 | Yasuda |
| 7,052,942 B1 | 5/2006 | Smart et al. |
| 7,211,822 B2 | 5/2007 | Nagahama et al. |
| 7,408,182 B1 | 8/2008 | Smart et al. |
| 7,449,762 B1 | 11/2008 | Singh |
| 7,459,356 B1 | 12/2008 | Smart et al. |
| 7,557,421 B1 | 7/2009 | Shealy et al. |
| 7,719,055 B1 | 5/2010 | McNutt et al. |
| 7,768,758 B2 | 8/2010 | Maier et al. |
| 7,804,262 B2 | 9/2010 | Schuster et al. |
| 7,935,983 B2 | 5/2011 | Saito et al. |
| 7,968,391 B1 | 6/2011 | Smart et al. |
| 7,974,322 B2 | 7/2011 | Ueda et al. |
| 8,017,981 B2 | 9/2011 | Sankin et al. |
| 8,405,068 B2 | 3/2013 | O'Keefe |
| 8,502,258 B2 | 8/2013 | O'Keefe |
| 8,633,518 B2 | 1/2014 | Suh et al. |
| 8,692,294 B2 | 4/2014 | Chu et al. |
| 8,785,976 B2 | 7/2014 | Nakajima et al. |
| 2001/0040246 A1 | 11/2001 | Ishii |
| 2001/0054848 A1 | 12/2001 | Baudelot et al. |
| 2002/0031851 A1 | 3/2002 | Linthicum et al. |
| 2002/0048302 A1 | 4/2002 | Kimura |
| 2002/0079508 A1* | 6/2002 | Yoshida ........................ 257/192 |
| 2003/0003630 A1 | 1/2003 | Iimura et al. |
| 2003/0122139 A1 | 7/2003 | Meng et al. |
| 2003/0160307 A1 | 8/2003 | Gibson et al. |
| 2003/0160317 A1 | 8/2003 | Sakamoto et al. |
| 2003/0206440 A1 | 11/2003 | Wong |
| 2003/0209730 A1 | 11/2003 | Gibson et al. |
| 2003/0218183 A1 | 11/2003 | Micovic et al. |
| 2004/0070003 A1 | 4/2004 | Gaska et al. |
| 2004/0130037 A1 | 7/2004 | Mishra et al. |
| 2004/0241916 A1 | 12/2004 | Chau et al. |
| 2005/0139868 A1 | 6/2005 | Anda |
| 2005/0189559 A1 | 9/2005 | Saito et al. |
| 2005/0189562 A1 | 9/2005 | Kinzer et al. |
| 2005/0194612 A1 | 9/2005 | Beach |
| 2005/0212049 A1 | 9/2005 | Onodera |
| 2005/0225912 A1 | 10/2005 | Pant et al. |
| 2005/0271107 A1 | 12/2005 | Murakami et al. |
| 2006/0043385 A1 | 3/2006 | Wang et al. |
| 2006/0068601 A1 | 3/2006 | Lee et al. |
| 2006/0124960 A1 | 6/2006 | Hirose et al. |

(56) References Cited

U.S. PATENT DOCUMENTS

| | | | |
|---|---|---|---|
| 2006/0243988 | A1 | 11/2006 | Narukawa et al. |
| 2007/0093009 | A1 | 4/2007 | Baptist et al. |
| 2007/0295985 | A1 | 12/2007 | Weeks et al. |
| 2008/0023706 | A1 | 1/2008 | Saito et al. |
| 2008/0073752 | A1 | 3/2008 | Asai et al. |
| 2008/0112448 | A1 | 5/2008 | Ueda et al. |
| 2008/0121875 | A1 | 5/2008 | Kim |
| 2008/0142837 | A1 | 6/2008 | Sato et al. |
| 2008/0179737 | A1 | 7/2008 | Haga et al. |
| 2008/0190355 | A1 | 8/2008 | Chen et al. |
| 2008/0272382 | A1 | 11/2008 | Kim et al. |
| 2008/0272422 | A1 | 11/2008 | Min |
| 2008/0283821 | A1 | 11/2008 | Park et al. |
| 2008/0308813 | A1 | 12/2008 | Suh et al. |
| 2009/0072269 | A1 | 3/2009 | Suh et al. |
| 2009/0146185 | A1 | 6/2009 | Suh et al. |
| 2009/0146186 | A1 | 6/2009 | Kub et al. |
| 2009/0166677 | A1 | 7/2009 | Shibata et al. |
| 2009/0278137 | A1 | 11/2009 | Sheridan et al. |
| 2010/0025657 | A1 | 2/2010 | Nagahama et al. |
| 2010/0133567 | A1 | 6/2010 | Son |
| 2010/0187575 | A1 | 7/2010 | Baumgartner et al. |
| 2010/0207164 | A1 | 8/2010 | Shibata et al. |
| 2010/0230656 | A1 | 9/2010 | O'Keefe |
| 2010/0230717 | A1 | 9/2010 | Saito |
| 2010/0258898 | A1 | 10/2010 | Lahreche |
| 2011/0017972 | A1 | 1/2011 | O'Keefe |
| 2011/0025422 | A1 | 2/2011 | Marra et al. |
| 2011/0095337 | A1 | 4/2011 | Sato |
| 2011/0101300 | A1 | 5/2011 | O'Keefe |
| 2011/0115025 | A1 | 5/2011 | Okamoto |
| 2011/0127586 | A1 | 6/2011 | Bobde et al. |
| 2011/0163342 | A1 | 7/2011 | Kim et al. |
| 2011/0175142 | A1 | 7/2011 | Tsurumi et al. |
| 2011/0199148 | A1 | 8/2011 | Iwamura |
| 2011/0211289 | A1 | 9/2011 | Kosowsky et al. |
| 2011/0242921 | A1 | 10/2011 | Tran et al. |
| 2011/0290174 | A1 | 12/2011 | Leonard et al. |
| 2012/0018735 | A1 | 1/2012 | Ishii |
| 2012/0126240 | A1 | 5/2012 | Won |
| 2012/0199875 | A1 | 8/2012 | Bhalla et al. |
| 2012/0211802 | A1* | 8/2012 | Tamari ............ 257/194 |
| 2012/0218783 | A1 | 8/2012 | Imada |
| 2012/0262220 | A1 | 10/2012 | Springett |
| 2013/0277687 | A1 | 10/2013 | Kobayashi et al. |
| 2013/0280877 | A1 | 10/2013 | Kobayashi et al. |

FOREIGN PATENT DOCUMENTS

| | | | |
|---|---|---|---|
| JP | 10242584 | A | 9/1998 |
| JP | 2000031535 | A | 1/2000 |
| JP | 2003332618 | A | 11/2003 |
| JP | 2008148511 | A | 6/2008 |
| JP | 2008258419 | A | 10/2008 |
| KR | 20070066051 | A | 6/2007 |
| WO | 2004051707 | A3 | 6/2004 |
| WO | 2011162243 | A1 | 12/2011 |

OTHER PUBLICATIONS

Chao, C-H., et al., "Theoretical demonstration of enhancement of light extraction of flip-chip GaN light-emitting diodes with photonic crystals," Applied Physics Letters, vol. 89, 2006, 4 pages.

Fath, P. et al., "Mechanical wafer engineering for high efficiency solar cells: An investigation of the induced surface damage," Conference Record of the Twenty-Fourth IEEE Photovoltaic Specialists Conference, Dec. 5-9, 1994, vol. 2, pp. 1347-1350.

Han, D.S. et al., "Improvement of Light Extraction Efficiency of Flip-Chip Light-Emitting Diode by Texturing the Bottom Side Surface of Sapphire Substrate," IEEE Photonics Technology Letters, Jul. 1, 2006, vol. 18, No. 13, pp. 1406-1408.

Hibbard, D.L. et al., "Low Resistance High Reflectance Contacts to p-GaN Using Oxidized Ni/Au and Al or Ag," Applied Physics Letters, vol. 83 No. 2, Jul. 14, 2003, pp. 311-313.

Lee, S.J., "Study of photon extraction efficiency in InGaN light-emitting diodes depending on chip structures and chip-mount schemes," Optical Engineering, SPIE, Jan. 2006, vol. 45, No. 1, 14 pages.

Shchekin, O.B. et al., "High performance thin-film flip-chip InGaN-GaN light-emitting diodes," Applied Physics Letters, vol. 89, 071109, Aug. 2006, 4 pages.

Wierer, J. et al., "High-power AlGaInN flip-chip light-emitting diodes," Applied Physics Letters, vol. 78 No. 22, May 28, 2001, pp. 3379-3381.

Windisch, R. et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.

Windisch, R. et al., "Impact of texture-enhanced transmission on high-efficiency surface-textured light-emitting diodes," Applied Physics Letters, Oct. 8, 2001, vol. 79, No. 15, pp. 2315-2317.

Advisory Action for U.S. Appl. No. 10/620,205, mailed Feb. 15, 2005, 2 pages.

Final Office Action for U.S. Appl. No. 10/620,205, mailed Dec. 16, 2004, 9 pages.

Non-Final Office Action for U.S. Appl. No. 10/620,205, mailed Jul. 23, 2004, 7 pages.

Non-Final Office Action for U.S. Appl. No. 10/620,205, mailed May 3, 2005, 10 pages.

Notice of Allowance for U.S. Appl. No. 10/620,205, mailed Dec. 8, 2005, 4 pages.

Non-Final Office Action for U.S. Appl. No. 10/689,980, mailed Jan. 26, 2005, 7 pages.

Non-Final Office Action for U.S. Appl. No. 10/689,980, mailed May 12, 2005, 8 pages.

Non-Final Office Action for U.S. Appl. No. 12/841,225 mailed Dec. 22, 2011, 8 pages.

Non-Final Office Action for U.S. Appl. No. 11/397,279, mailed Oct. 31, 2007, 7 pages.

Notice of Allowance for U.S. Appl. No. 11/397,279, mailed Apr. 17, 2008, 7 pages.

Final Office Action for U.S. Appl. No. 10/689,979, mailed Jun. 29, 2005, 16 pages.

Non-Final Office Action for U.S. Appl. No. 10/689,979, mailed Jan. 11, 2005, 14 pages.

Notice of Allowance for U.S. Appl. No. 10/689,979, mailed Oct. 26, 2005, 6 pages.

Notice of Allowance for U.S. Appl. No. 12/841,225, mailed Nov. 9, 2012, 5 pages.

Non-Final Office Action for U.S. Appl. No. 11/360,734, mailed Jan. 18, 2008, 10 pages.

Notice of Allowance for U.S. Appl. No. 11/360,734, mailed Aug. 7, 2008, 6 pages.

Non-Final Office Action for U.S. Appl. No. 12/841,257 mailed Jan. 5, 2012, 13 pages.

Advisory Action for U.S. Appl. No. 11/937,207, mailed Feb. 2, 2010, 2 pages.

Final Office Action for U.S. Appl. No. 11/937,207, mailed Nov. 19, 2009, 9 pages.

Non-Final Office Action for U.S. Appl. No. 11/937,207, mailed Mar. 18, 2010, 10 pages.

Non-Final Office Action for U.S. Appl. No. 11/937,207, mailed May 29, 2009, 11 pages.

Notice of Allowance for U.S. Appl. No. 11/937,207, mailed Feb. 28, 2011, 8 pages.

Quayle Action for U.S. Appl. No. 11/937,207, mailed Nov. 24, 2010, 4 pages.

Final Office Action for U.S. Appl. No. 11/458,833, mailed Dec. 15, 2008, 13 pages.

Non-Final Office Action for U.S. Appl. No. 11/458,833, mailed Apr. 1, 2008, 10 pages.

Notice of Allowance for U.S. Appl. No. 11/458,833, mailed Mar. 9, 2009, 7 pages.

Invitation to Pay Fees for PCT/US2013/056105, mailed Nov. 5, 2013, 7 pages.

International Search Report and Written Opinion for PCT/US2013/056126, mailed Oct. 25, 2013, 10 pages.

(56) References Cited

OTHER PUBLICATIONS

International Search Report and Written Opinion for PCT/US2013/056132, mailed Oct. 10, 2013, 11 pages.
International Search Report and Written Opinion for PCT/US2013/056187, mailed Oct. 10, 2013, 11 pages.
International Search Report for GB0902558.6, issued Jun. 15, 2010, by the UK Intellectual Property Office, 2 pages.
Examination Report for British Patent Application No. 0902558.6, mailed Nov. 16, 2012, 5 pages.
Examination Report for British Patent Application No. GB0902558.6, issued Feb. 28, 2013, 2 pages.
Non-Final Office Action for U.S. Appl. No. 12/705,869, mailed Feb. 9, 2012, 10 pages.
Notice of Allowance for U.S. Appl. No. 12/705,869, mailed Apr. 4, 2013, 9 pages.
Notice of Allowance for U.S. Appl. No. 12/705,869, mailed Jul. 19, 2012, 8 pages.
Advisory Action for U.S. Appl. No. 12/841,225, mailed Apr. 16, 2012, 3 pages.
Final Office Action for U.S. Appl. No. 12/841,225 mailed Feb. 1, 2012, 9 pages.
Non-Final Office Action for U.S. Appl. No. 12/841,225, mailed May 2, 2012, 10 pages.
International Search Report and Written Opinion for PCT/US2013/056105, mailed Feb. 12, 2014, 15 pages.
Non-Final Office Action for U.S. Appl. No. 13/927,182, mailed May 1, 2014, 7 pages.
Non-Final Office Action for U.S. Appl. No. 13/973,482, mailed May 23, 2014, 8 pages.
Non-Final Office Action for U.S. Appl. No. 13/795,986, mailed Apr. 24, 2014, 13 pages.
Non-Final Office Action for U.S. Appl. No. 13/910,202, mailed Sep. 25, 2014, 9 pages.
Final Office Action for U.S. Appl. No. 13/927,182, mailed Sep. 17, 2014, 10 pages.
Non-Final Office Action for U.S. Appl. No. 13/974,488, mailed Oct. 28, 2014, 8 pages.
Non-Final Office Action for U.S. Appl. No. 13/957,698, mailed Nov. 5, 2014, 11 pages.
Final Office Action for U.S. Appl. No. 13/973,482, mailed Nov. 5, 2014, 9 pages.
Non-Final Office Action for U.S. Appl. No. 13/795,926, mailed Dec. 19, 2014, 14 pages.
Non-Final Office Action for U.S. Appl. No. 13/942,998, mailed Nov. 19, 2014, 9 pages.
Non-Final Office Action for U.S. Appl. No. 13/871,526, mailed Dec. 16, 2014, 17 pages.
Final Office Action for U.S. Appl. No. 13/910,202, mailed Jan. 20, 2015, 10 pages.
Notice of Allowance for U.S. Appl. No. 13/914,060, mailed Nov. 13, 2014, 8 pages.
Final Office Action for U.S. Appl. No. 13/795,986, mailed Dec. 5, 2014, 16 pages.
International Preliminary Report on Patentability for PCT/US2013/1056105, mailed Mar. 5, 2015, 12 pages.
International Preliminary Report on Patentability for PCT/US2013/1056126, mailed Mar. 5, 2015, 7 pages.
International Preliminary Report on Patentability for PCT/US2013/1056132, mailed Mar. 5, 2015, 9 pages.
International Preliminary Report on Patentability for PCT/US2013/1056187, mailed Mar. 12, 2015, 9 pages.
Advisory Action for U.S. Appl. No. 13/910,202, mailed Apr. 6, 2015, 3 pages.
Notice of Allowance for U.S. Appl. No. 13/910,202, mailed May 14, 2015, 9 pages.
Final Office Action for U.S. Appl. No. 13/974,488, mailed Feb. 20, 2015, 8 pages.
Notice of Allowance for U.S. Appl. No. 13/957,698, mailed Mar. 30, 2015, 7 pages.
Notice of Allowance for U.S. Appl. No. 13/973,482, mailed May 4, 2015, 7 pages.
Notice of Allowance for U.S. Appl. No. 13/795,986, mailed Mar. 6, 2015, 8 pages.
Non-Final Office Action for U.S. Appl. No. 14/067,019, mailed Mar. 25, 2015, 7 pages.
Notice of Allowance for U.S. Appl. No. 13/795,926, mailed Apr. 27, 2015, 8 pages.
Notice of Allowance for U.S. Appl. No. 131942,998, mailed Apr. 27, 2015, 8 pages.

* cited by examiner

FIELD EFFECT TRANSISTOR (FET) HAVING FINGERS WITH RIPPLED EDGES

RELATED APPLICATIONS

This application claims the benefit of U.S. provisional patent applications No. 61/693,399, filed Aug. 27, 2012, and No. 61/815,083, filed Apr. 23, 2013, the disclosures of which are incorporated herein by reference in their entireties.

FIELD OF THE DISCLOSURE

The present disclosure relates to structures for field effect transistors (FETs), and in particular to structures for drain, gate, and source fingers.

BACKGROUND

Generally, lateral field effect transistors use an interdigitated layout with source, gate, and drain fingers side-by-side on a wafer front side. The interdigitated finger layout may be repeated for multiples of the source, gate and drain fingers. The fingers may be electrically connected to bond pads or to vertical vias that contact other metal layers or the backside of the wafer. Multiple fingers of a like designation (i.e., source, gate, and drain) may be electrically connected in parallel. Examples of lateral field effect transistors (FETs) include Silicon laterally diffused metal oxide semiconductor (LDMOS), gallium arsenide (GaAs) pseudomorphic high electron mobility transistors (pHEMT), and gallium nitride (GaN) HEMTs. FIG. 1 is a cross-sectional view depicting an active area of a GaN HEMT 10 that is typical of the prior art. GaN HEMT 10 includes a substrate 12, a buffer layer 14 disposed on top of the substrate 12, a GaN layer 16, and a device layer 18 made of aluminum gallium nitride (AlGaN). In this particular example, an outer surface of the AlGaN layer is a wafer front side 20. A source finger 22, a gate finger 24, and a drain finger 26 are disposed on the wafer front side 20 spaced from and parallel to each other. A width W is a greatest dimension of a transistor finger such as shown for the drain finger 26. In contrast, a length L is the minimum distance between the edges of a finger such as shown for the gate finger 24. Typically, the source finger 22, the gate finger 24, and the drain finger 26 have connections to bond pads or vias that are not shown in FIG. 1. The spacing between the source finger 22, the gate finger 24, and the drain finger 26 is determined by a required breakdown voltage limit, electrical field intensity limit, or photolithographic limit. A current flow and an on-resistance of a channel between the source finger 22 and the drain finger 26 are determined by properties of a semiconductor material making up the channel, the physical dimensions of the channel, an electrical contact resistance between the source finger 22 or the drain finger 26, and a semiconductor layer such as device layer 18. Moreover, other factors that affect the on-resistance of a channel include the ability of the gate finger 24, with proper bias, to control the depletion layer of the channel within the device layer 18.

In general, a larger active area created with wider fingers or greater numbers of narrow fingers will facilitate lower on-resistance and an ability to handle more current. A larger active area unfortunately means greater parasitic capacitance and inductance along with a larger and more expensive wafer die. Improved finger structures are needed to allow wider source, gate, and drain fingers without increasing an active area over the active area of a traditional FET.

SUMMARY

A field effect transistor (FET) having rippled fingers is disclosed. The FET includes a semiconductor substrate having a front side with a finger axis. A drain finger is disposed on a front side of the semiconductor substrate such that a greatest dimension of the drain finger lies parallel to the finger axis. A gate finger is disposed on the front side of the semiconductor substrate, wherein the gate finger is spaced from the drain finger such that a greatest dimension of the gate finger lies parallel to the finger axis. Moreover, a source finger is disposed on the front side of the semiconductor substrate, wherein the source finger is spaced from the gate finger such that a greatest dimension of the source finger lies parallel to the finger axis. The drain finger, the gate finger, and the source finger each have rippled edges with ripples having peaks and troughs that are equally disposed about an axis that is about parallel with the finger axis. As a result of having fingers with rippled edges, the FET of the present disclosure has a larger active finger periphery with wider fingers that allow for a lower on-resistance and an ability to handle a larger current than a FET having straight finger edges.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Figure 1:
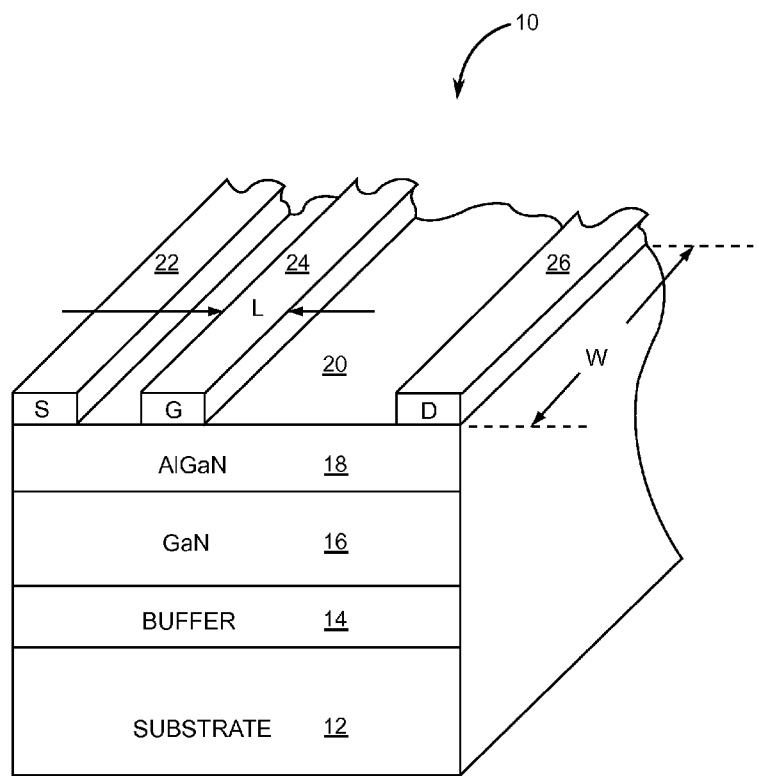
FIG. 1 is a cross-sectional view depicting an active area of a gallium nitride (GaN) high electron mobility transistor (HEMT) that is typical of the prior art.
Figure 2:
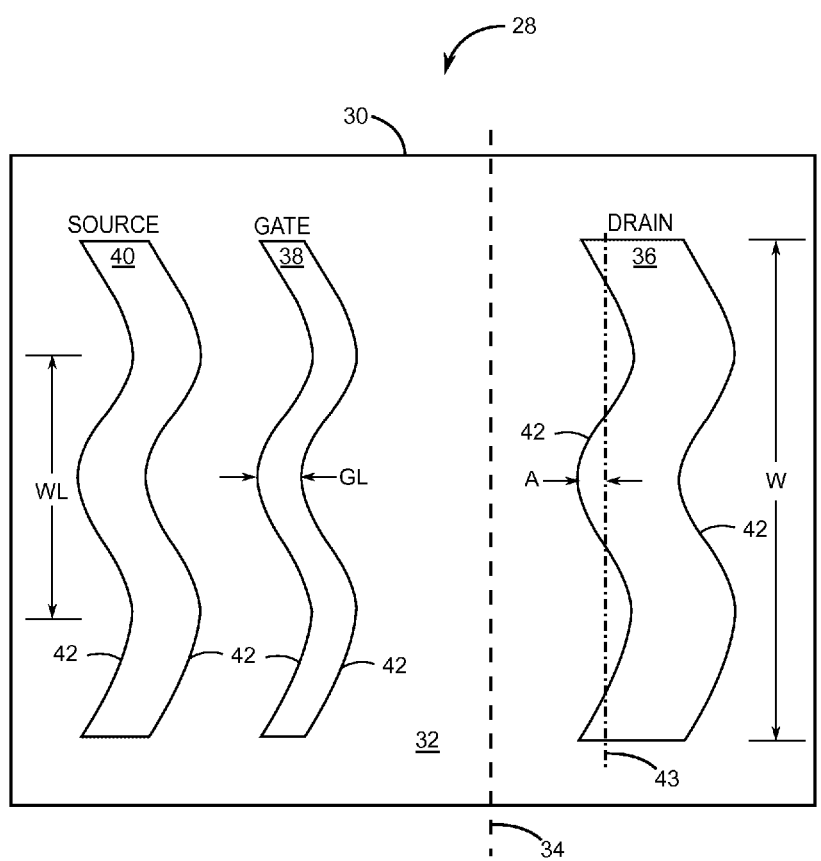
FIG. 2 is a top plan view of an exemplary embodiment of a field effect transistor (FET) having rippled fingers in accordance with the present disclosure.

FIG. 2 is a top plan view of an exemplary embodiment of a field effect transistor (FET) 28 having rippled fingers in accordance with the present disclosure. In particular, the FET 28 includes a semiconductor substrate 30 having a front side 32 with a finger axis 34. A drain finger 36 is disposed on the front side 32 of the semiconductor substrate 30 such that the width W of the drain finger 36 lies parallel to the finger axis 34. A gate finger 38 is disposed on the front side 32 of the semiconductor substrate 30 and is spaced from the drain finger 36 such that the width W of the gate finger 38 lies parallel to the finger axis 34. A source finger 40 is also disposed on the front side 32 of the semiconductor substrate 30 while being spaced from the gate finger 38 such that the width W of the source finger 40 lies parallel to the finger axis 34. In this case, the width W is a greatest dimension for the drain finger 36, the gate finger 38, and the source finger 40, which each have rippled edges 42 that each have ripples with peaks and troughs that are equally disposed about an axis such as axis 43 that is about parallel with the finger axis 34. While it is to be understood that the rippled edges 42 can have practically any periodic profile, the rippled edges 42 in FIG. 2 are approximately sinusoidal and have a wavelength WL that is a multiple of a gate length GL, which is a minimum distance between the rippled edges of the gate finger 38. The wavelength WL is typically a multiple of a minimum GL with the multiple being from around about 1 to around about 10. While not particularly drawn to scale, an exemplary wavelength for the rippled edges 42 shown in FIG. 2 is approximately 5 to 6 times the gate length GL of the gate finger 38. Moreover, the amplitude of the rippled edges 42 in FIG. 2 is a fraction of the gate length GL of the gate finger 38. The amplitude of the rippled edges 42 typically have a fixed amplitude that is a fraction of GL with the fraction being from around about 50% to around about 500%. In the exemplary case shown in FIG. 2, the amplitude of the rippled edges 42 is about ½ the gate length GL of the gate finger 38. Moreover, in at least one embodiment it is advantageous for the ripples of the drain finger 36 to have variable wavelengths, which are in phase with the ripples of the gate finger 38, which are in phase with the ripples of the source finger 40. For example, the WL for ripples centrally located along axis 43 can be less than the WL for ripples at either end of the drain finger 36. At least one advantage for having variable WL is for dissipating a greater heat build-up for the drain finger 36 near ripples centrally located along axis 43.

Figure 3:
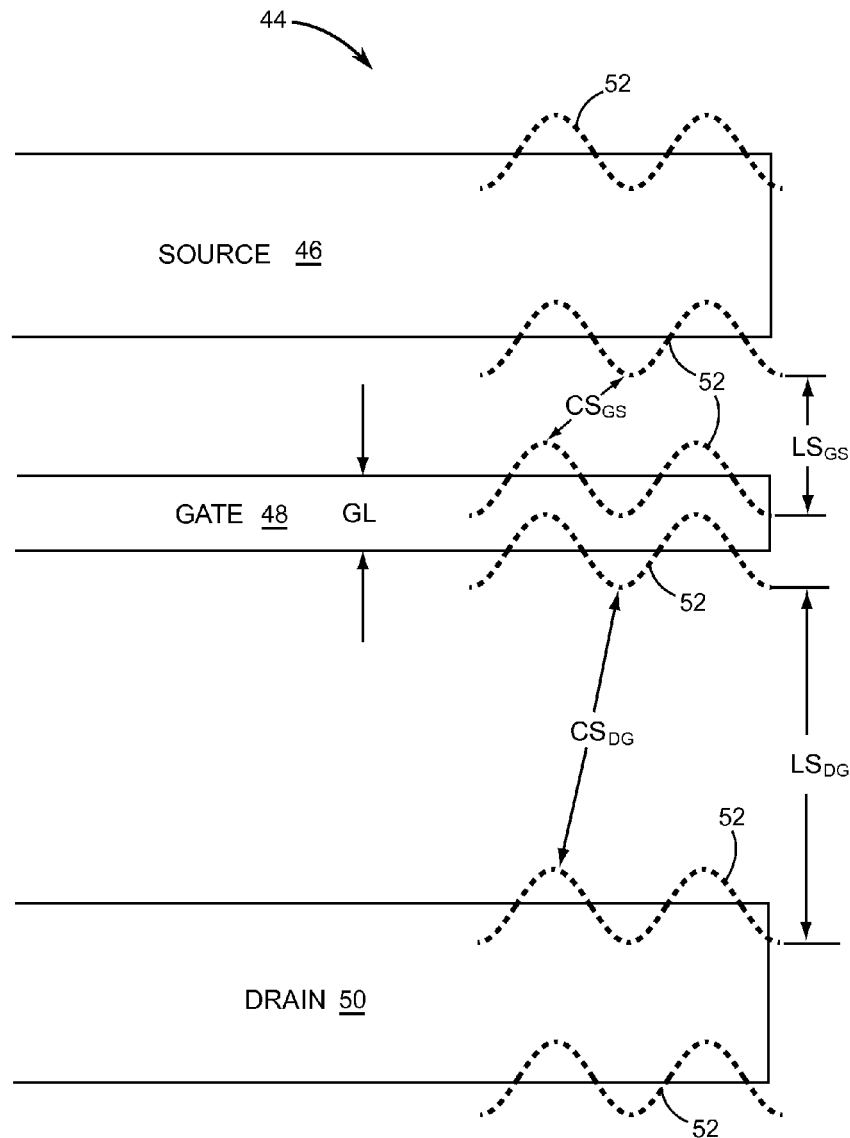
FIG. 3 is a partial plan view of another exemplary embodiment of a FET having rippled fingers in accordance with the present disclosure.

FIG. 3 is a partial plan view of another exemplary embodiment of a FET 44 having rippled fingers in accordance with the present disclosure. Instead of straight edges depicted in a solid line, a source finger 46, a gate finger 48, and a drain finger 50 have rippled edges 52, which are depicted in dashed lines. A lateral spacing ($LS_{GS}$) between the source finger 46 and the gate finger 48 is constant between the source finger 46 and the gate finger 48. Similarly, a lateral spacing ($LS_{DG}$) between the drain finger 50 and the gate finger 48 is constant between the drain finger 50 and the gate finger 48. However, a critical spacing ($CS_{GS}$) between the gate finger 48 and the source finger 46 decreases with increasing amplitude of the rippled edges 52. Likewise, a critical spacing ($CS_{DG}$) between the drain finger 50 and the gate finger 48 decreases with increasing amplitude of the rippled edges 52. The reduction in the $CS_{GS}$ and the $CS_{DG}$ is evaluated with respect to desired operational voltage of the FET 44. If it is determined that either the $CS_{GS}$ or the $CS_{DG}$ is too close and may cause a voltage breakdown, an electrical field intensity problem and/or a photolithographic problem, the lateral spacing, either the $LS_{GS}$ and/or the $LS_{DG}$ will be increased to resolve indicated problems. Typically, any increase of the $LS_{GS}$ and/or the $LS_{DG}$ will be relatively slight.

The FET 44 as depicted in FIG. 3 has a wavelength for the rippled edges 52 that is approximately 2 to 3 times the gate length (GL) of the gate finger 48. An exemplary GL is on the order of 1 micron. A preferred wavelength range for a 1 micron GL is from around about 0.5 micron to around about 5 microns.

An on-resistance ($RDS_{ON}$) of a lateral FET such as the FET 44 is due to several resistive elements (not shown). Primarily, a source contact resistance and a drain contact resistance, a channel resistance, along with a resistance of a drift region between the gate finger 48 and the drain finger 50 make up the $RDS_{ON}$. By adding the rippled edges 52, all of the resistive elements will be reduced except for the drift region, which remains unaffected by the rippled edges 52.

Figure 4:
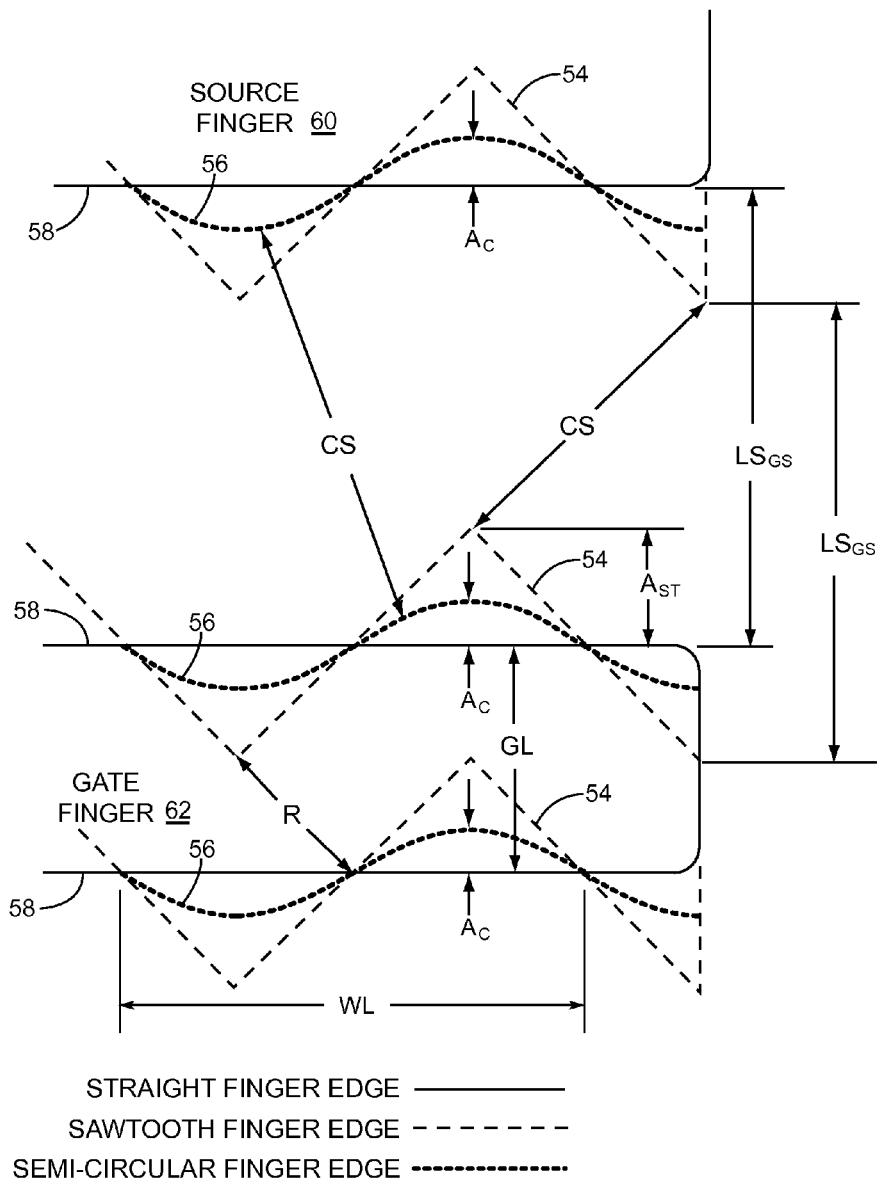
FIG. 4 is a detailed plan view of saw-tooth shaped rippled edges, and semi-circular shaped rippled edges compared to traditional straight edges for traditional transistor fingers.

FIG. 4 is a detailed plan view of saw-tooth rippled edges 54 having a saw-tooth profile, and semi-circular rippled edges 56 having a profile of peaks and troughs made up of alternating semicircles that replace traditional straight edges 58 for traditional transistor fingers such as a traditional source finger 60 and a traditional gate finger 62. The saw-tooth rippled edges 54 each have constant amplitude $A_{ST}$ and a wavelength WL. An exemplary $A_{ST}$ is equal to ½ the gate length GL, while an exemplary WL is equal to 4 times GL. As result of these exemplary values for $A_{ST}$ and WL for the saw-tooth rippled edges 54, the finger width for either of the traditional source finger 60 or the traditional gate finger 62 will be increased by around about 41%. However, the CS is reduced by around about 29% in this example. As discussed above, a reduced CS can be mitigated by spacing transistor fingers relatively slightly farther apart.

Exemplary ones of the semi-circular rippled edges 56 are made up of alternating ¼ circle sections that each have a radius R equal to $(\sqrt{2}) \times A_C$, where $A_C$ is the amplitude of the semi-circular rippled edges. For this example, the WL remains equal to 4 times GL, but the semi-circular rippled edges 56 have an advantage over the saw-tooth rippled edges 54 in that the semi-circular rippled edges 56 have no sharp edges that might increase a susceptibly to voltage breakdown. For instance, if the width W of the traditional gate finger 62 is increased by 11%, the CS will be reduced by 12%. Therefore, in many cases it is relatively easier to maintain voltage breakdown and low electric field density by avoiding rippled edges having sharp points like the saw-tooth rippled edges 54. Thus, the saw-tooth rippled edges 54 are better suited for low voltage applications, whereas wavy rippled edges like the semi-circular rippled edges 56 and the sinusoidal like rippled edges 42 (FIG. 2) are better suited for relatively higher voltage applications. In any case, significant costs reductions are realized by the present disclosure by providing greater finger width in an area that is smaller than possible using traditional straight edge type transistor fingers for a similar current flow, on-resistance, and breakdown voltage.

Those skilled in the art will recognize improvements and modifications to the embodiments of the present disclosure.

All such improvements and modifications are considered within the scope of the concepts disclosed herein and the claims that follow.

What is claimed is:

1. A field effect transistor (FET) having an active region comprising:
   a semiconductor substrate having a front side with a finger axis;
   a drain finger disposed on the front side of the semiconductor substrate over the active region such that a greatest dimension of the drain finger lies parallel to the finger axis;
   a gate finger disposed on the front side of the semiconductor substrate over the active region and being spaced from the drain finger such that a greatest dimension of the gate finger lies parallel to the finger axis; and
   a source finger disposed on the front side of the semiconductor substrate over the active region and being spaced from the gate finger such that a greatest dimension of the source finger lies parallel to the finger axis wherein the drain finger, the gate finger, and the source finger each have rippled edges that each have ripples with peaks and troughs that are equally disposed about an axis that is about parallel with the finger axis.

2. The FET of claim 1 wherein the rippled edges have a saw-tooth profile.

3. The FET of claim 1 wherein the rippled edges have a profile of peaks and troughs made up of alternating semicircles.

4. The FET of claim 1 wherein the rippled edges have a periodic profile.

5. The FET of claim 1 wherein the drain finger is spaced from the gate finger to maintain a minimum critical space that is dependent upon a desired minimum breakdown voltage limit between the drain finger and the gate finger.

6. The FET of claim 1 wherein the each of the rippled edges of the drain finger, the gate finger, and the source finger have ripples with a fixed wavelength and fixed amplitude.

7. The FET of claim 6 wherein the fixed wavelength is a multiple of a minimum distance between the rippled edges of the gate finger with the multiple being from around about 1 to around about 10.

8. The FET of claim 6 wherein the fixed amplitude is a fraction of a minimum distance between the rippled edges of the gate finger with the fraction being from around about 50% to around about 500%.

9. The FET of claim 1 wherein the ripples of the drain finger have variable wavelengths, which are in phase with the ripples of the gate finger, which are in phase with the ripples of the source finger.

10. The FET of claim 1 wherein a gallium nitride (GaN) layer is disposed on the semiconductor substrate.

11. A method of fabricating a field effect transistor (FET) having an active region comprising:
    providing a semiconductor substrate having a front side with a finger axis;
    disposing a drain finger with rippled edges that each include ripples having peaks and troughs that are equally disposed about an axis that is about parallel with the finger axis on the front side of the semiconductor substrate over the active region such that a greatest dimension of the drain finger lies parallel to the finger axis;
    disposing a gate finger with rippled edges that each include ripples having peaks and troughs that are equally disposed about an axis that is about parallel with the finger axis on the front side of the semiconductor substrate over the active region and being spaced from the drain finger such that a greatest dimension of the gate finger lies parallel to the finger axis; and
    disposing a source finger with rippled edges that each include ripples having peaks and troughs that are equally disposed about an axis that is about parallel with the finger axis on the front side of the semiconductor substrate over the active region and being spaced from the gate finger such that a greatest dimension of the source finger lies parallel to the finger axis.

12. The method of claim 11 wherein the rippled edges have a saw-tooth profile.

13. The method of claim 11 wherein the rippled edges have a profile of peaks and troughs made up of alternating semicircles.

14. The method of claim 11 wherein the rippled edges have a periodic profile.

15. The method of claim 11 wherein the drain finger is spaced from the gate finger to maintain a minimum critical space that is dependent upon a desired minimum breakdown voltage limit between the drain figure and the gate finger.

16. The method of claim 11 wherein the each of the rippled edges of the drain finger, the gate finger, and the source finger have ripples with a fixed wavelength and fixed amplitude.

17. The method of claim 16 wherein the fixed wavelength is a multiple of a minimum distance between the rippled edges of the gate finger with the multiple being from around about 1 to around about 10.

18. The method of claim 16 wherein the fixed amplitude is a fraction of a minimum distance between the rippled edges of the gate finger with the fraction being from around about 50% to around about 500%.

19. The method of claim 11 wherein the ripples of the drain finger have variable wavelengths, which are in phase with the ripples of the gate finger, which are in phase with the ripples of the source finger.

20. The method of claim 11 further including disposing a GaN layer onto the semiconductor substrate.

* * * * *

UNITED STATES PATENT AND TRADEMARK OFFICE
CERTIFICATE OF CORRECTION

| | | |
|---|---|---|
| PATENT NO. | : 9,070,761 B2 | Page 1 of 1 |
| APPLICATION NO. | : 13/966400 | |
| DATED | : June 30, 2015 | |
| INVENTOR(S) | : Joseph Herbert Johnson | |

It is certified that error appears in the above-identified patent and that said Letters Patent is hereby corrected as shown below:

In the claims,

Column 5,
In claim 1, line 18, delete "rippled"

In claim 4, line 1, replace "rippled edges" with --ripples--

In claim 6, line 1, delete "rippled"

In claim 7, line 2, delete "rippled"

In claim 8, line 2, delete "rippled"

Column 6,
In claim 11, lines 5, 11, 18, delete "rippled"

In claim 14, line 1, replace "rippled edges" with --ripples--

In claim 16, line 1, delete "rippled"

In claim 17, lines 2-3, replace "rippled edges" with --ripples--

In claim 18, line 2, delete "rippled"

Signed and Sealed this
Twenty-second Day of December, 2015

Michelle K. Lee
*Director of the United States Patent and Trademark Office*